United States Patent
Leussler

[11] Patent Number: 6,043,658
[45] Date of Patent: Mar. 28, 2000

[54] MR APPARATUS INCLUDING AN MR COIL SYSTEM

[75] Inventor: Christoph Leussler, Hamburg, Germany

[73] Assignee: U.S. Philips Corporation, New York, N.Y.

[21] Appl. No.: 09/009,999

[22] Filed: Jan. 21, 1998

[30] Foreign Application Priority Data

Jan. 23, 1997 [DE] Germany ............................ 197 02 256

[51] Int. Cl.[7] ..................................................... G01V 3/00
[52] U.S. Cl. .......................... 324/318; 324/322; 324/309; 600/422
[58] Field of Search ................................. 324/318, 322, 324/303, 309, 307; 600/422

[56] References Cited

U.S. PATENT DOCUMENTS 4,680,548  7/1987  Edelstein et al. ........................ 324/318
5,777,474  7/1998  Srinivasan ................................ 324/318

OTHER PUBLICATIONS

James Tropp, "The Hybrid Bird Cage Resonator", Proceedings of the 11th SMR, p. 4009, 1992.

*Primary Examiner*—Christine K. Oda
*Assistant Examiner*—Brij B. Shrivastav
*Attorney, Agent, or Firm*—Dwight H. Renfrew

[57] ABSTRACT

An MR apparatus includes an MR coil system of the so-called bird cage type which operates in a degenerate mode of operation in which all resonance modes and all resonance frequencies coincide. It has been found that the individual meshes of the MR coil system are then decoupled from one another, thus enabling operation as a coil array, the individual MR signals being processed in separate processing channels so as to form MR sub-images which can be combined in a reconstruction unit so as to form an MR overall image having an improved signal-to-noise ratio.

7 Claims, 3 Drawing Sheets

MR APPARATUS INCLUDING AN MR COIL SYSTEM

BACKGROUND OF THE INVENTION

1. Field of the Invention

The invention relates to an MR apparatus which includes an MR coil system which serves to receive MR signals from an examination zone and comprises two similar conductor loops which include capacitances and are interconnected via conductors which include several capacitances, every two neighboring conductors and the conductor loop sections situated therebetween constituting a respective mesh, and also relates to an MR coil system suitable for this purpose.

2. Description of Related Art

An MR coil system of this kind is known from U.S. Pat. No. 4,680,548. The two conductor loops thereof are generally shaped as two equally large coaxial circles which are interconnected by the conductors. This construction gives the MR coil system the appearance of a bird cage, which is why this coil system is also known as a bird cage coil.

A bird cage coil of this kind has as many different resonance frequencies as it comprises conductors. Each resonance frequency is associated with a different resonant mode, the bird cage coil always operating in the resonant mode in which an as uniform as possible field distribution (in the case of operation as a transmitter coil) or a location-independent constant sensitivity (in the case of operation as a receiving coil) is obtained inside the coil. This location-independency of the sensitivity, notably in a plane perpendicular to the coil axis, is advantageous because it facilitates the reconstruction of an MR image from the MR signals received by the MR coil system. However, there are coil arrays which consist of a plurality of usually flat sub-coils and have a signal-to-noise ratio which is better than that of such a bird cage coil.

Therefore, it is an object of the invention to improve an MR apparatus of the kind set forth in this respect. This object is achieved according to the invention in that the capacitances are proportioned so that only a single resonance frequency occurs, that at least two processing channels are provided for the separate processing of the MR signals occurring in the various meshes and for generating MR data which represents the nuclear magnetization distribution in the examination zone, and that there is provided a reconstruction unit for forming an MR overall image from the MR data from the processing channels.

The invention is based on the recognition of the fact that the MR coil system has only a single resonance frequency when the capacitances in the two conductor loops and the interconnecting conductors are proportioned in a given way, and that at this resonance frequency the individual meshes constituting the MR coil system (a mesh comprises two neighboring conductors and the sections of the two conductor loops which are situated therebetween) are decoupled from one another. Because of the decoupling, the signals received from the individual meshes can be independently processed so as to form MR images like in a coil array. A common MR image can be reconstructed from the individual MR images, said common MR image having a particularly high signal-to-noise ratio, notably at the areas within the coil system which adjoin the meshes. The individual meshes have a sensitivity which is strongly location-dependent, i.e. a very high sensitivity for signals from areas neighboring the meshes and a comparatively low sensitivity for signals from more remote areas. In order to obtain an MR image having such a high signal-to-noise ratio throughout the entire outer area, therefore, it is necessary to combine the MR data or MR images acquired from the individual meshes so as to form an MR overall image. The term "MR overall image", however, is to be broadly interpreted. It is to be understood to mean not only a representation of the spatial distribution but also the spectroscopic distribution.

Accordingly, in an MR coil system with two similar conductor loops which include capacitances and are interconnected via a plurality of conductors which include capacitances an improved signal-to-noise ratio is achieved in that for the reception of a plurality of MR signals with a location-dependent sensitivity within the area enclosed by the coil system the capacitances are proportioned so that only a single resonance frequency occurs.

In a further embodiment of the invention, a respective processing channel is provided for each capacitance of one of the two conductor loops. Because a separate processing channel is thus provided for each mesh, the MR overall image reconstructed from the MR data from the individual processing channels has the best possible signal-to-noise ratio. However, substantial means are required since a processing channel must be provided for each mesh.

In another embodiment of the invention, however, a respective combination circuit is provided for every two neighboring capacitances in a conductor loop, a respective processing channel being connected to each combination circuit. In that case a processing channel is required only for every two meshes, because the signals of each time two neighboring meshes are combined via the combination circuit. However, the best possible signal-to-noise ratio will then be achieved only at a few areas of the MR overall image.

As has already been stated, the individual meshes have a strong location-dependent sensitivity which must be determined for the reconstruction of an optimum MR overall image. It is known that this requires an MR coil which has a substantially location-independent sensitivity throughout the entire examination zone. Therefore, a further embodiment of the invention is provided with switching units for switching the capacitances of the MR coil system between a first and a second mode of operation, the MR coil system having only a single resonance frequency in the first mode of operation and several resonance modes with different resonance frequencies in the second mode of operation, the resonance mode with a locally uniform coil sensitivity lying at a resonance frequency which corresponds to the single resonance frequency in the first mode of operation.

Thus, in the first mode of operation the MR coil system operates as a coil array, locally having a high but overall a strongly location-dependent sensitivity, and in the second mode of operation as a conventional bird cage coil having a substantially location-independent mean sensitivity.

BRIEF DESCRIPTION OF THE DRAWINGS

The invention will be described in detail hereinafter with reference to the drawing. Therein.

DETAILED DESCRIPTION OF THE PREFERRED EMBODIMENTS

Figure 1:
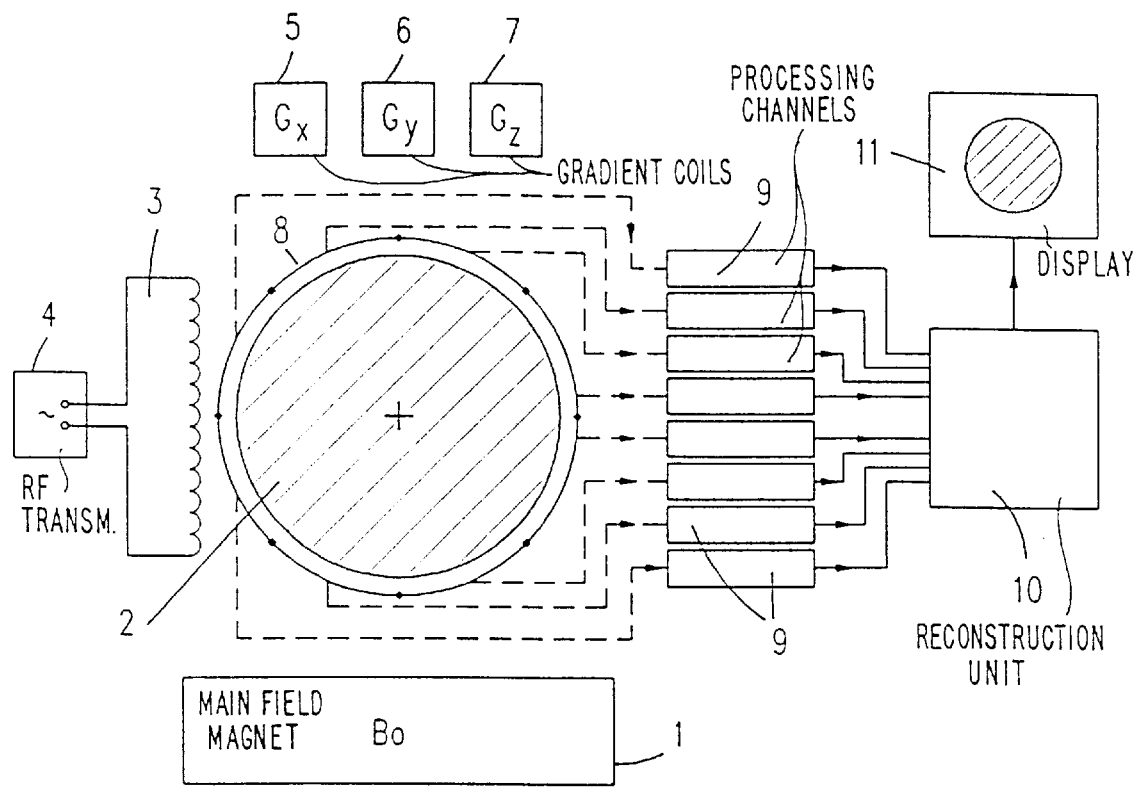
FIG. 1 shows a block diagram of an MR apparatus according to the invention.

FIG. 1 shows a main field magnet 1 which generates a uniform, steady magnetic field having a strength of, for example 1.5 Tesla in an examination zone 2 in which an object to be examined may be arranged. The reference numeral 3 denotes an RF coil which is connected to an RF transmitter 4 and produces two magnetic RF pulses in the examination zone, said pulses having the Larmor frequency predetermined by the strength of the magnetic field. This frequency amounts to approximately 63.8 MHz for a magnetic field having a strength of 1.5 Tesla.

Also provided are three gradient coils 5, 6 and 7 which are capable of generating magnetic fields in the examination zone which extend in the same direction as the steady magnetic field generated by the main field magnet but have a gradient in the x, the y or the z direction. Using these gradient coils, the excitation of the nuclear magnetization produced by the RF coil 3 can be limited to a given volume or the MR signals arising can thus be coded in respect of phase or frequency, enabling the formation of MR images of the examination zone.

The MR signals arising are received by an MR coil system 8. This MR coil system is subdivided into eight sections or meshes, each of which is connected, as denoted by dashed lines, to a separate processing channel 9. In each processing channel 9 the MR signal is demodulated, decoded and digitized and MR data is generated, for example by means of a Fourier transformation, which MR data represent the nuclear magnetization distribution in the area covered by the respective mesh, i.e. a respective MR image of this area. The MR individual images can be combined by means of a reconstruction unit 10 so as to form an MR overall image which represents the nuclear magnetization distribution in the area enclosed by the MR coil system 8. The signal-to-noise ratio at the center of this MR overall image is substantially the same as that in an MR image formed by means of a bird cage coil of the same geometry; the signal-to-noise ratio, however, is a factor from 2 to 4 better at the area of the edges.

Figure 2:
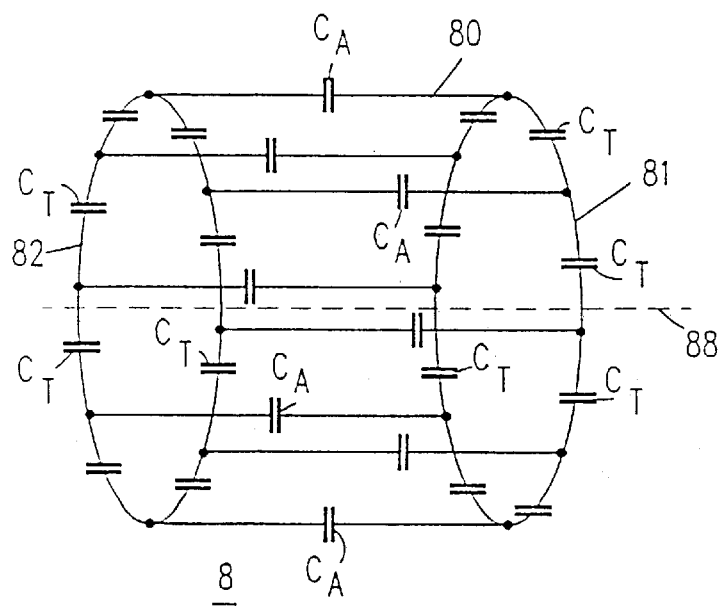
FIG. 2 shows the construction of the MR coil system used therein.

FIG. 2 is a detailed representation of the MR coil system 8 which is only diagrammatically shown in FIG. 1. This coil system is constructed so as to be rotationally symmetrical relative to a symmetry axis 88 and includes two equally large, preferably circular conductor loops 81 and 82 which are arranged coaxially with the symmetry axis 88 and in planes extending perpendicularly to this axis. The two conductor loops 81 and 82 are electrically interconnected via, for example eight (or another even number) conductors 80. Each of these straight conductors includes a capacitor having the capacitance $C_A$ and each of the segments of the conductor loops 81 and 82 between every two conductors 80 also includes a respective capacitor having the capacitance $C_T$.

The conductors and conductor loops may consist of copper strips which have a width of 10 mm and are arranged on a suitably insulated supporting member which is made, for example of plexiglass. In the case of a head coil of this kind, the conductors 80 may have a length of 120 mm and the conductor loops 81, 82 a diameter of 250 mm. MR coils having such a geometrical construction are known per se from U.S. Pat. No. 4,680,548.

The electrical behavior of these coils will be described in detail hereinafter with reference to FIG. 3 which shows the various resonance frequencies (ordinate) and resonance modes (abscissa). It holds in principle that such a coil has a number of resonance modes or resonance frequencies which amounts to half the number of conductors 80 present. The present embodiment involving eight conductors, therefore, has four different resonance frequencies and four different resonance modes (with a different field distribution or with a different location-dependent sensitivity). The resonance frequencies and resonance modes associated with a given proportioning of the coil are interconnected by dashed curves. Two different coil types can be distinguished:

a) The low-pass type which is characterized in that the conductor loops 81, 82 do not have capacitances $C_T$, so that only the locally distributed inductances of the individual segments of the conductor loops are active. There are four different resonance frequencies, the lowest resonance frequency being associated with a resonance mode for which a uniform field distribution or sensitivity occurs in the area enclosed by the coil and which is, therefore, recommended. The other resonance modes, at the higher resonance frequencies, have field distributions which are less suitable and hence are not used. A curve for this type is denoted by the reference LP in FIG. 3. For the given geometrical coil parameters, for this type the lowest resonance frequency occurs at 63.8 MHz when the capacitance $C_A$ in the conductors 80 has a value of 18 pF.

b) The high-pass type is formed when capacitors are present only in the conductor loops 81 and 82, whereas the conductors 80 do not include a capacitor and consist of continuous conductors so that only the locally distributed inductances of the individual conductors are active. This type also has four resonance frequencies with four resonance modes (in the case of eight conductors), the preferred resonance mode, however, lying at the highest frequency. The curve resulting for this type is denoted by the reference HP in FIG. 3; for the given coil dimensions, a highest resonance frequency then occurs at 63.8 MHz when the capacitance $C_T$ has a value of 61 pF.

c) As appears from FIG. 2, the band-pass type includes capacitors in the conductor loops as well as in the conductors. In conformity with the cited United States patent, a "high-pass" or "low-pass" behavior can be assigned to this bandpass type, depending on whether the conductors with the capacitances $C_A$ or the conductor loop segments with the capacitances $C_T$ behave inductively (the behavior of the respective other part being capacitive).

Figure 3:
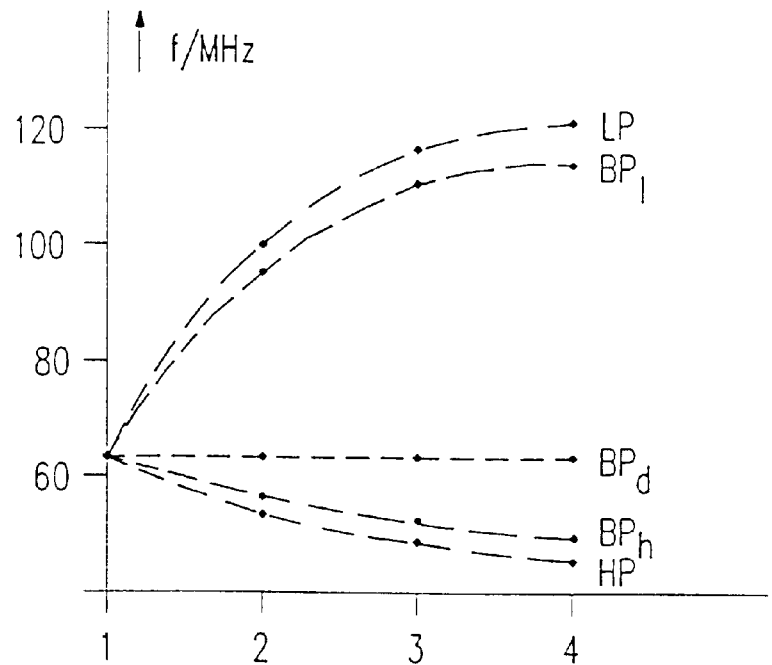
FIG. 3 shows a diagram wherefrom the various resonance frequencies or resonance modes can be derived.

The curve for such a band-pass type with low-pass behavior is denoted by the reference $BP_1$ in FIG. 3, the preferred resonance mode (with locally uniform sensitivity) lying at the lowest resonance frequency. For the given dimensions of the coil this resonance frequency lies at 63.8 MHz when the capacitance $C_A$ has a value of 21 pF and the capacitance $C_T$ a value of 420 pF.

The band-pass type with high-pass behavior is represented by the curve $BP_h$ in FIG. 3. For this type the preferred resonance mode lies at the highest resonance frequency. For the given dimensions of the coil this resonance frequency lies at 63.8 MHz when $C_A$ has a value of 325 pF and $C_T$ a value of 65 pF.

The invention also constitutes a band-pass type because it includes capacitances in the conductors as well as in the conductor loops, but the capacitances are proportioned so that neither a high-pass behavior nor a low-pass behavior occurs, but only the behavior represented by the line $BP_d$ in FIG. 3 where all resonance modes occur at the same frequency. For the given dimensions of the coil this behavior is obtained at 63.8 MHz when the capacitance $C_A$ has a value of 118 pF and the capacitance $C_T$ a value of 72 pF.

In a publication by Tropp (Proceedings of the 11th SMRM, page 4009, 1992) this behavior is referred to as "degenerate". The inventor, however, has recognized the fact that in the case of such proportioning the individual meshes, formed by two neighboring conductors and the interconnecting sections of the conductor loops 81 and 82, are decoupled from the neighboring conductor loops. This property enables operation of the coil system as a coil array and the reconstruction of an MR overall image from the MR images of the individual meshes. The individual meshes have a high sensitivity for the parts of the examination zone situated in their vicinity, but their sensitivity for more remote areas is only low. However, when an MR overall image is formed from the MR individual images of the individual meshes, a signal-to-noise ratio is obtained which, in comparison with a conventionally operating bird cage coil, is a factor from 2 to 4 higher in the outer areas whereas at its center it has the same value as offered by a conventional coil.

Figure 4:
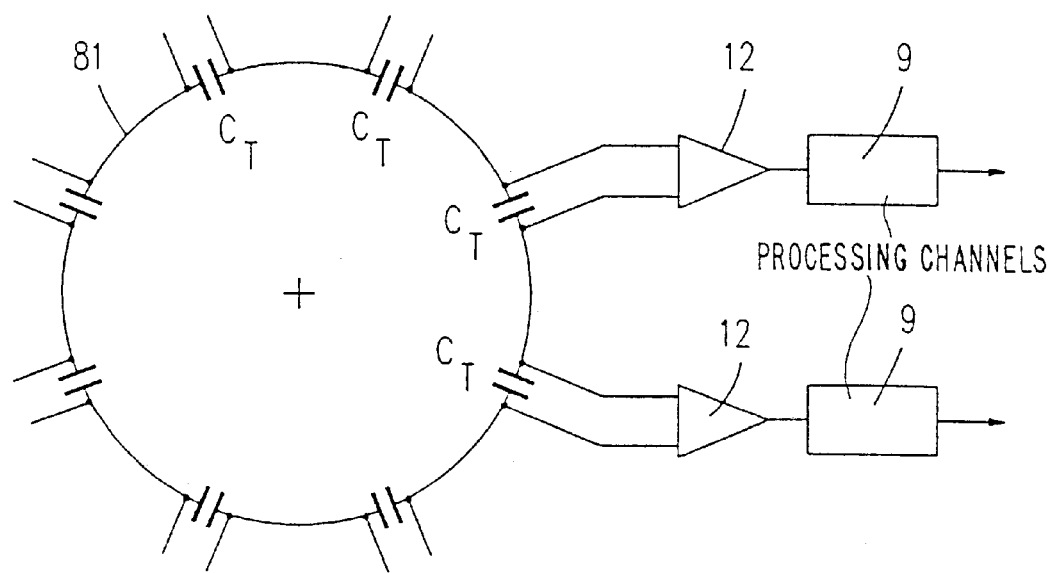
FIG. 4 shows a first signal processing possibility.

FIG. 4 illustrates how the signals can be derived from the meshes. It shows that the signals are derived from each of the capacitors $C_T$ by means of a high-impedance amplifier. Because these capacitors are always associated with a respective mesh only, the voltage across this capacitor represents the MR signal induced in the mesh. The signals derived from the capacitors $C_T$ are applied to the processing channels 9 via a respective one of the amplifiers 12. This is shown for two meshes only in FIG. 2, but the signals from all meshes are processed in this manner.

Figure 5:
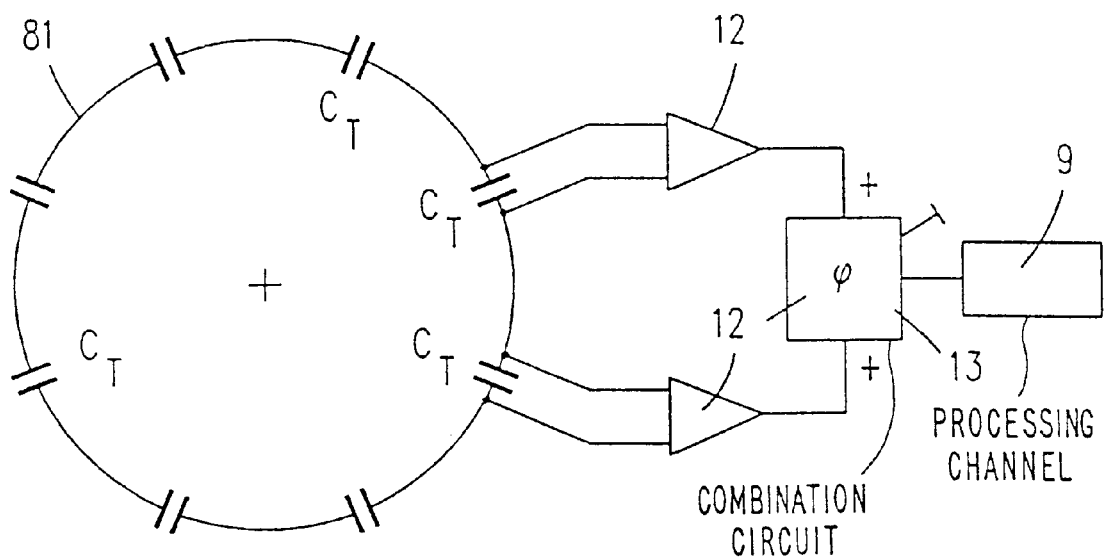
FIG. 5 shows a second signal processing possibility.

It is a drawback of this processing principle that eight processing channels are required (when the MR coil comprises eight meshes or eight conductors 80). An MR apparatus comprising fewer processing channels, therefore, cannot process the MR signals in this manner. Therefore, FIG. 5 shows a solution which requires only half the number of channels. To this end, the signals from each time two neighboring meshes are applied, via a respective amplifier 12, to the inputs of a combination circuit 13. The combination circuit adds the signals present at its two inputs with an adjustable phase shift. The output signal of the combination circuit 13 is processed by a processing channel 9 so that in this case only four processing channels are required for eight meshes. The MR overall image formed from the MR data from the individual processing channels has the best attainable signal-to-noise ratio in areas whose position is dependent on the phase with which the signals from two meshes are combined. Therefore, this optimum can be shifted to preferred areas by changing the phase position.

In many cases it is desirable to have available, in addition to a coil array having a strong location-dependent sensitivity, a coil which has a substantially uniform sensitivity in the examination zone, for example a conventional bird cage coil. Using such a coil, the sensitivity variation of the coil array could be measured as described in European patent application 695 947 (PHD 94.098).

Figure 6:
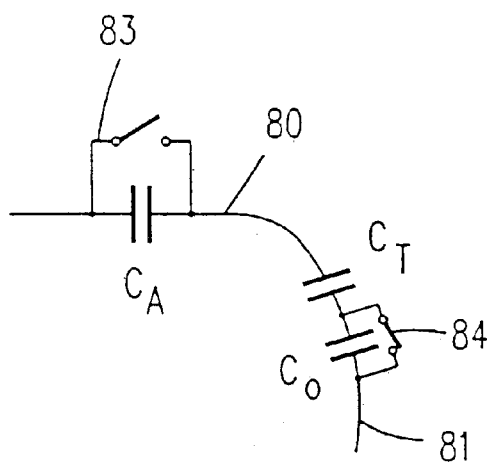
FIG. 6 shows a part of an MR coil system which can be switched between a first and a second mode of operation.

To this end, all capacitances in the conductors and in the conductor loops are switched over by means of switching units. This is shown for one of the capacitances in the conductors 80 and for one of the capacitances in the conductor loops 81 in FIG. 6. The capacitance $C_A$ is then bridged by a controllable switch 83, for example a pin diode, which short-circuits the capacitance when the switch 83 is closed. In series with the individual capacitances $C_T$ there is connected a respective capacitor $C_O$ which is bridged by a switch 84.

In a first mode of operation the switch 83 is open and the switch 84 is closed. The capacitances $C_A$ and $C_T$ are then active and the mode of operation according to the invention, in which neighboring meshes are decoupled from one another, is obtained. In a second mode of operation, the switch 83 is closed and the switch 84 is open. The capacitance $C_A$ is then short-circuited (so that a bird cage having a high-pass behavior is obtained) and the capacitance $C_O$ appears in series with the respective capacitance $C_T$. When the capacitance $C_O$ is proportioned so that the series connection has a value of 61 pF, the highest resonance frequency (with the desired resonance mode) will lie at 63.8 MHz.

Two MR coils of different electrical behavior can thus be obtained by switching over the capacitances. Switching over from one coil type to the other can take place without having to exchange the coils.

The invention has been described on the basis of an embodiment involving eight conductors 80 or eight meshes. However, it is also possible to use a different even number of conductors or meshes, for example 16. Furthermore, circular conductor loops were assumed, but other shapes are also feasible, for example polygons (having as many angles as there are conductors) or elliptical shapes. The conductor loops need not necessarily be closed and one of the meshes may possibly be omitted. One of the two conductor loops may also include additional conductor structures so as to provide a field concentration for applications in the region of the head.

All references cited herein are incorporated herein by reference in their entirety and for all purposes to the same extent as if each individual publication or patent or patent application was specifically and individually indicated to be incorporated by reference in its entirety for all purposes.

I claim:

1. An MR apparatus comprising:
   an MR coil system which serves to receive MR signals from an examination zone and comprises two similar conductor loops which include first capacitances and which are interconnected via conductors each of which includes a second capacitance, every two neighboring conductors and the conductor loop sections situated therebetween constituting a respective mesh, wherein the first and second capacitances in each mesh are proportioned so that only a single resonance frequency occurs in the MR coil system,
   at least two processing channels for the separate processing of MR signals occurring in at least two different meshes and for generating MR data which represents the nuclear magnetization distribution in the examination zone, and
   a reconstruction unit for forming an MR overall image from the MR data from the processing channels.

2. An MR apparatus as claimed in claim 1, wherein a separate processing channel is provided for each mesh.

3. An MR apparatus as claimed in claim 1, further comprising
   one or more combination circuits, each combination circuit for every two neighboring meshes, and wherein a processing channel is connected to each combination circuit.

4. An MR coil system comprising:
   two similar conductor loops which include first capacitances and are interconnected via a plurality of conductors which include second capacitances,
   wherein for the reception of a plurality of MR signals with a location-dependent sensitivity within the area enclosed by the coil system the capacitances are proportioned so that only a single resonance frequency occurs, and wherein every two neighboring conductors and the conductor loop sections there between form a mesh with a connection for separate processing of received MR signals.

5. The apparatus of claim 1 further comprising at least three processing channels for the separate processing of the MR signals occurring in the various meshes.

6. The apparatus of claim 1 wherein there are at least eight separate meshes.

7. An MR apparatus comprising:

an MR coil system which serves to receive MR signals from an examination zone and comprises two similar conductor loops which include first capacitances and which are interconnected via conductors each of which includes a second capacitance, every two neighboring conductors and the conductor loop sections situated there between constituting a respective mesh, wherein the first and second capacitances in each mesh are proportioned so that only a single resonance frequency occurs in the MR coil system, a switching unit for switching the capacitances of the MR coil system between a first and a second mode of operation, the MR coil system having only a single resonance frequency in the first mode of operation and several resonance modes with different resonance frequencies in the second mode of operation, the resonance mode with a locally uniform coil sensitivity in the second mode of operation lying at a resonance frequency which corresponds to the single resonance frequency in the first mode of operation, at least two processing channels for the separate processing of MR signals occurring in at least two different meshes and for generating MR data which represents the nuclear magnetization distribution in the examination zone, and a reconstruction unit for forming an MR overall image from the MR data from the processing channels.

* * * * *